United States Patent
Kotani et al.

(10) Patent No.: US 12,284,765 B2
(45) Date of Patent: Apr. 22, 2025

(54) COMPONENT MOUNTING MACHINE

(71) Applicant: FUJI CORPORATION, Chiryu (JP)

(72) Inventors: Kazuya Kotani, Toyota (JP); Yuta Yokoi, Kariya (JP); Mikiya Suzuki, Nishio (JP)

(73) Assignee: FUJI CORPORATION, Chiryu (JP)

( * ) Notice: Subject to any disclaimer, the term of this patent is extended or adjusted under 35 U.S.C. 154(b) by 543 days.

(21) Appl. No.: 17/641,655

(22) PCT Filed: Sep. 11, 2019

(86) PCT No.: PCT/JP2019/035665
§ 371 (c)(1),
(2) Date: Mar. 9, 2022

(87) PCT Pub. No.: WO2021/048948
PCT Pub. Date: Mar. 18, 2021

(65) Prior Publication Data
US 2022/0312659 A1  Sep. 29, 2022

(51) Int. Cl.
*H05K 13/08* (2006.01)
*H05K 13/04* (2006.01)

(52) U.S. Cl.
CPC ....... *H05K 13/0812* (2018.08); *H05K 13/041* (2018.08); *H05K 13/0813* (2018.08); *H05K 13/086* (2018.08); *Y10T 29/49131* (2015.01)

(58) Field of Classification Search
CPC ............ H05K 13/0408; H05K 13/041; H05K 13/0413; H05K 13/081; H05K 13/0812;
(Continued)

(56) References Cited

U.S. PATENT DOCUMENTS

| | | | |
|---|---|---|---|
| 2003/0027363 A1* | 2/2003 | Kodama | G05B 19/4065 438/14 |
| 2009/0000110 A1* | 1/2009 | Maenishi | H05K 13/041 29/832 |

(Continued)

FOREIGN PATENT DOCUMENTS

| | | |
|---|---|---|
| JP | 2002-111299 A | 4/2002 |
| JP | 2011-40792 A | 2/2011 |
| JP | 2011-66041 A | 3/2011 |

OTHER PUBLICATIONS

International Search Report issued Dec. 3, 2019 in PCT/JP2019/035665 filed Sep. 11, 2019, 1 page.

*Primary Examiner* — Aneeta Yodichkas
*Assistant Examiner* — Joshua D Anderson
(74) *Attorney, Agent, or Firm* — Oblon, McClelland, Maier & Neustadt, L.L.P.

(57) ABSTRACT

A component mounting machine includes a head having a holding member configured to hold the component, and a control device. The control device performs a pre-mounting inspection for inspecting a state of a component held in the holding member, and controls the head so that the component held in the holding member is mounted on the board in a case where a determination of normality is made in the pre-mounting inspection. In addition, the control device performs a post-mounting inspection for inspecting a state of the component already mounted on the board by the head in a case where a determination of abnormality is made in the pre-mounting inspection or in a case where a determination of abnormality suspicion is made which is within an allowable range determined to be normal but is suspected to be abnormal in the pre-mounting inspection.

6 Claims, 9 Drawing Sheets

(58) Field of Classification Search
CPC ........... H05K 13/0813; H05K 13/0815; H05K 13/083; H05K 13/0882; Y10T 29/4913; Y10T 29/49131; Y10T 29/49133; Y10T 29/53174; Y10T 29/53178
See application file for complete search history.

(56) References Cited

U.S. PATENT DOCUMENTS

| | | | |
|---|---|---|---|
| 2010/0152877 A1 | 6/2010 | Maenishi | |
| 2017/0064883 A1* | 3/2017 | Kawai | H05K 13/0408 |
| 2018/0153061 A1* | 5/2018 | Iisaka | G06T 7/60 |
| 2018/0310446 A1* | 10/2018 | Takama | H05K 13/0465 |

* cited by examiner

COMPONENT MOUNTING MACHINE

TECHNICAL FIELD

The present specification discloses a component mounting machine.

BACKGROUND ART

Conventionally, a component mounting machine for holding a component by a holding member such as a suction nozzle and mounting the component on a board is known. For example, Patent Literature 1 discloses a component mounting machine that images a mounting state of a component with a high-speed video camera that stores image data for a predetermined period in a memory and sequentially updates the image data. The component mounting machine images the mounting state of the component by the high-speed video camera, detects the good or bad of the component mounting using a laser displacement sensor immediately after each mounting operation, and when detecting the mounting failure of the component, acquires image data for a predetermined time immediately before that time from the high-speed video camera to the memory of a video recorder. As a result, it is supposed that the component mounting operation when a mounting error occurs can be confirmed by an image, so that the analysis of the mounting error can be appropriately performed.

PATENT LITERATURE

Patent Literature 1: JP-A-2002-111299

BRIEF SUMMARY

Technical Problem

However, in the component mounting machine described above, since it is detected the good or bad of the component every time the mounting operation is performed, it takes time to detect, and the productivity is deteriorated. In addition, in the component mounting machine described above, a dedicated video camera or video recorder is required to confirm the mounting state of the component, which leads to an increase in size and cost of the device.

It is a main object of the present disclosure to provide a component mounting machine capable of detecting occurrence of a defective product at an early stage while suppressing deterioration of productivity.

Solution to Problem

The present disclosure adopts the following means to achieve the main object described above.

A component mounting machine the present disclosure that holds and mounts a component on a board, and it is a gist to include a head having a holding member configured to hold the component; and a control device configured to perform a pre-mounting inspection for inspecting a state of the component held in the holding member, control the head so that the component held in the holding member is mounted on the board in a case where a determination of normality is made in the pre-mounting inspection, and perform a post-mounting inspection for inspecting a state of the component already mounted on the board by the head in a case where a determination of abnormality is made in the pre-mounting inspection or in a case where a determination of abnormality suspicion is made which is within an allowable range determined to be normal but is suspected to be abnormal in the pre-mounting inspection.

The component mounting machine according to the present disclosure includes the head configured to include the holding member configured to hold the component, and the control device configured to control the head. The control device performs a pre-mounting inspection for inspecting a state of a component held in the holding member, and controls the head so that the component held in the holding member is mounted on the board in a case where a determination of normality is made in the pre-mounting inspection. In addition, the control device performs a post-mounting inspection for inspecting a state of the component already mounted on the board by the head in a case where a determination of abnormality is made in the pre-mounting inspection or in a case where a determination of abnormality suspicion is made which is within an allowable range determined to be normal but is suspected to be abnormal in the pre-mounting inspection. Since the allowable range is determined in the determination of the pre-mounting inspection, abnormality may be overlooked by erroneous determination in the pre-mounting inspection depending on the determined allowable range. Therefore, in a case where the determination of abnormality or the determination of abnormality suspicion is made in the pre-mounting inspection, the component mounting machine of the present disclosure performs the post-mounting inspection on a component that has passed the pre-mounting inspection before the determination and was already mounted. As a result, it is possible to appropriately perform the post-mounting inspection to detect occurrence of a defective product at an early stage. In addition, since the component mounting machine of the present disclosure performs the post-mounting inspection in a case where the determination of abnormality or the determination of abnormality suspicion is made in the pre-mounting inspection, it is possible to suppress the deterioration of the productivity as compared with a device that performs the post-mounting inspection on all of the components mounted on the board. As a result, it is possible to provide the component mounting machine capable of detecting the occurrence of the defective product at an early stage while suppressing the deterioration of the productivity.

DESCRIPTION OF EMBODIMENTS

Next, embodiments of the present disclosure will be described with reference to the drawings.

Figure 1:
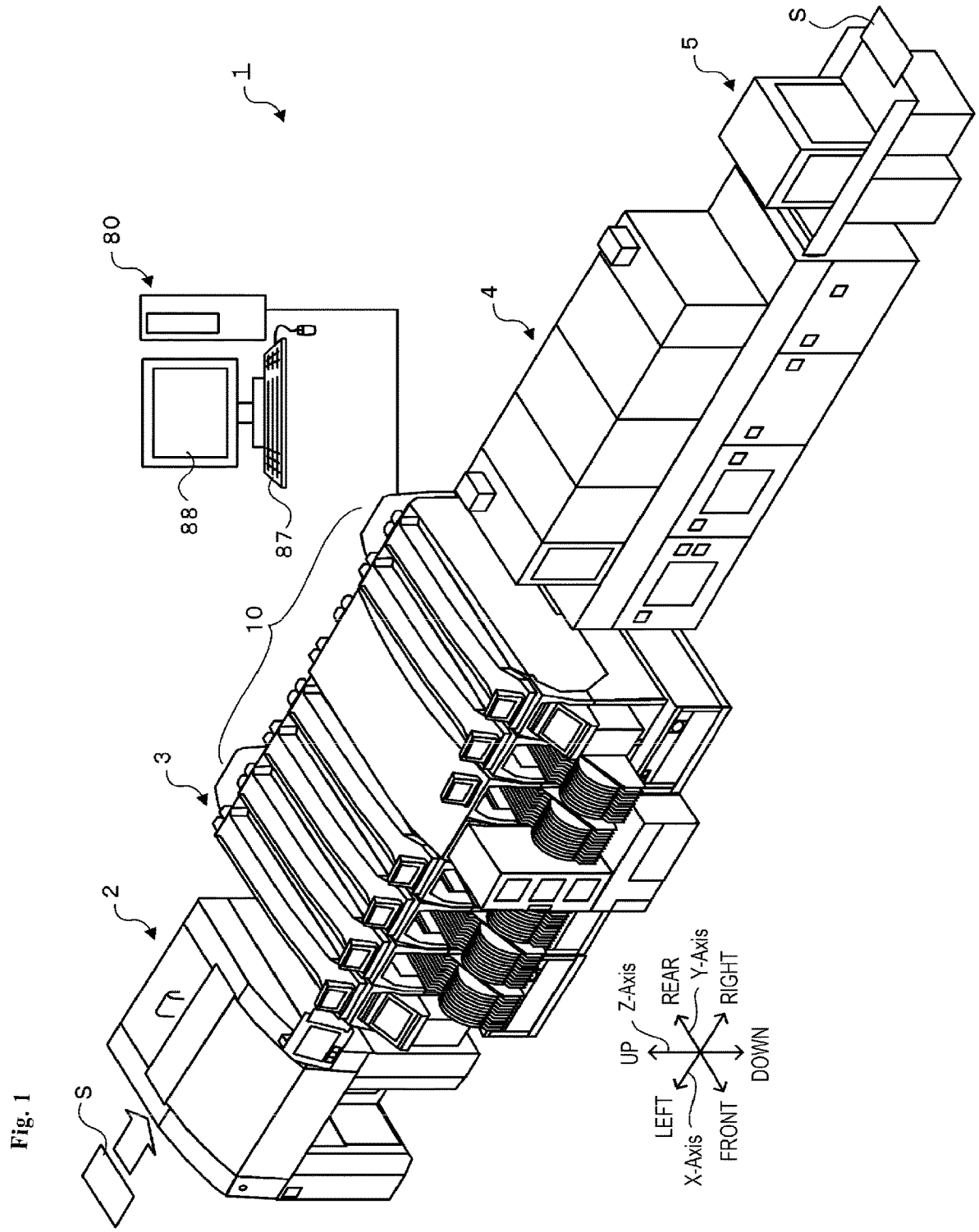
FIG. 1 is a configuration view schematically illustrating a configuration of component mounting system 1 including component mounting machine 10 of the present embodiment.
Figure 2:
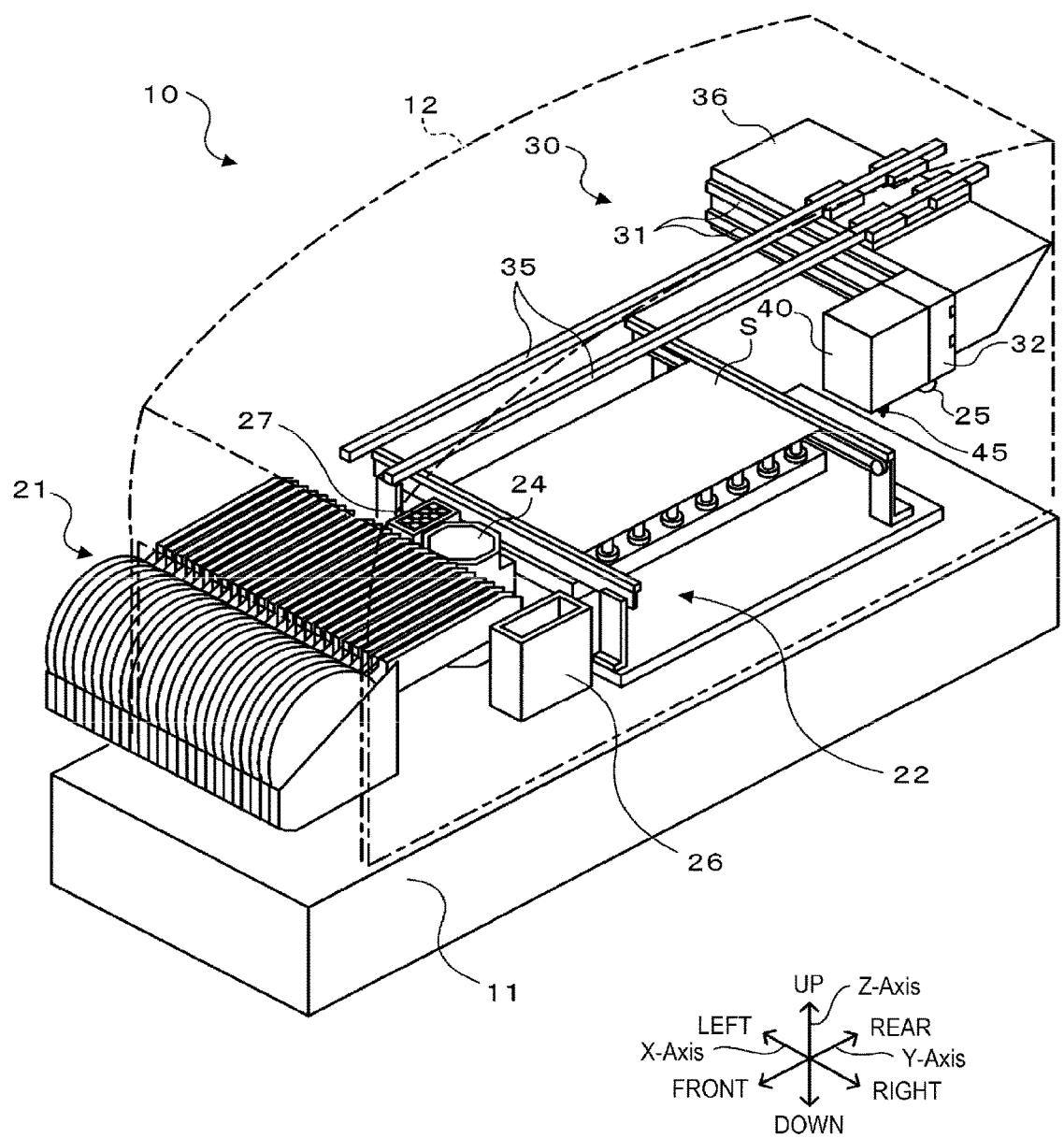
FIG. 2 is a configuration view schematically illustrating a configuration of component mounting machine 10.
Figure 3:
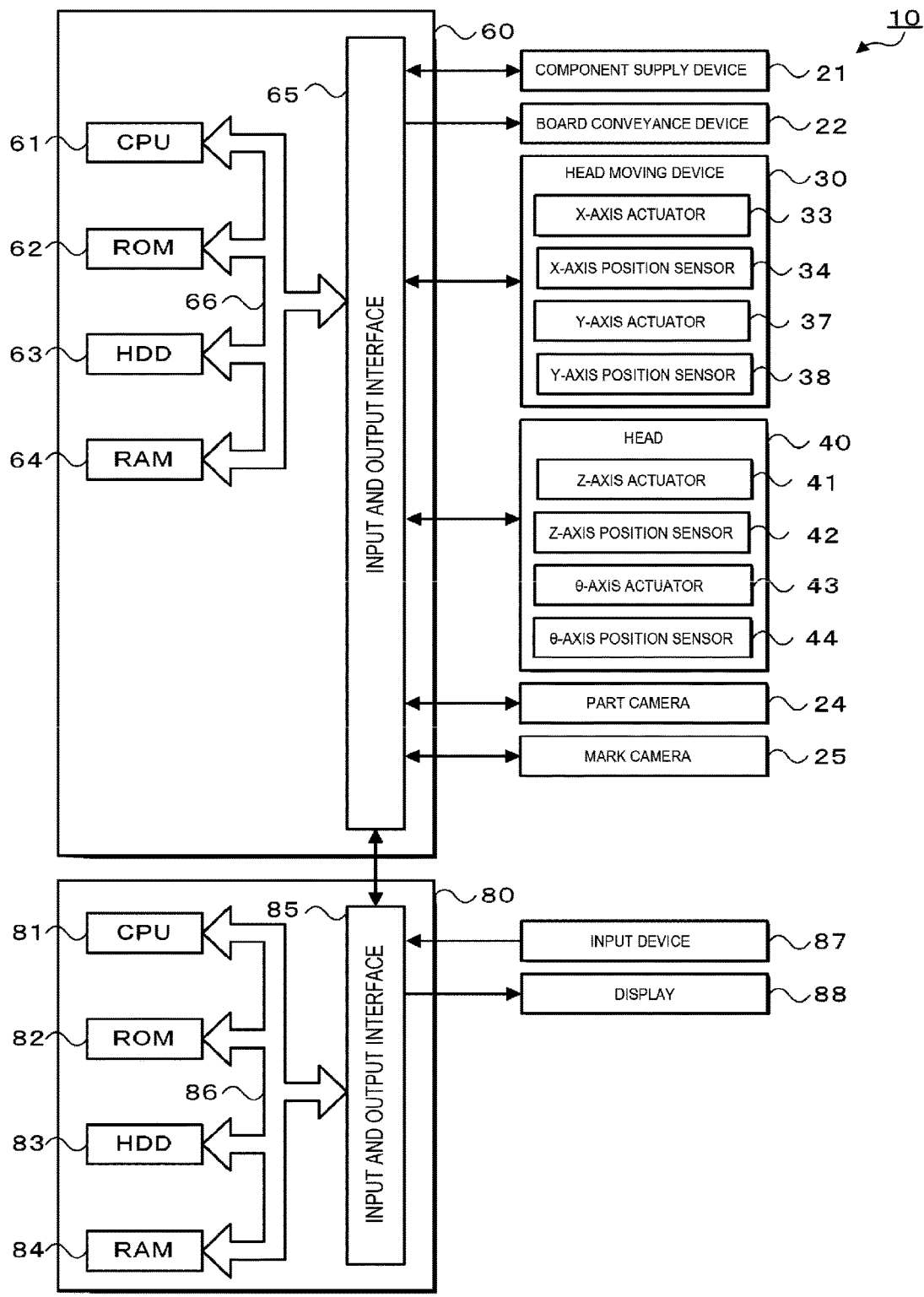
FIG. 3 is a block diagram illustrating an electrical connection relationship between control device 60 and management device 80 of component mounting machine 10.

FIG. 1 is a configuration view schematically illustrating a configuration of component mounting system 1 including component mounting machine 10 of the present embodiment. FIG. 2 is a configuration view schematically illustrating a configuration of component mounting machine 10. FIG. 3 is an explanatory diagram illustrating the electrical connection relationship between control device 60 of component mounting machine 10 and management device 80. In FIGS. 1 and 2, the left-right direction is the X-axis direction, the front-rear (depth) direction is the Y-axis direction, and the up-down direction is the Z-axis direction.

As illustrated in FIG. 1, component mounting system 1 is provided with printer 2, print inspection device 3, component mounting machine 10, reflow device 4, mounting inspection device 5, and management device 80 that controls the entire system. Here, printer 2 prints solder on board S. Print inspection device 3 inspects a state of the solder printed on board S. Component mounting machine 10 mounts a component on board S. Reflow device 4 is a device that heats board S to melt the solder, and then cools board S to electrically connect and fix the components on board S. Mounting inspection device 5 is a device that inspects the state of a component mounted on board S. Hereinafter, component mounting machine 10 will be described in more detail.

As illustrated in FIG. 2, component mounting machine 10 is provided with component supply device 21, board conveyance device 22, head moving device 30, head 40, and control device 60 (refer to FIG. 3). In addition, component mounting machine 10 is provided with part camera 24, mark camera 25, discard box 26, nozzle station 27, and the like, in addition to these devices. Multiple component mounting machines 10 are arranged side by side in the board conveyance direction (X-axis direction) to form a production line. The production line is managed by management device 80.

Component supply device 21 is provided with a tape feeder provided at a front end portion of base plate 11 of component mounting machine 10. The tape feeder is disposed so as to be arranged in the left-right direction (X-axis direction), and supplies components by drawing a tape in which components are accommodated in each of multiple recessed portions formed at predetermined intervals in the longitudinal direction from a reel in the front-rear direction (Y-axis direction).

Board conveyance device 22 is provided with a pair of conveyor rails disposed on base plate 11 at intervals in the front-rear direction (Y-axis direction). Board conveyance device 22 conveys board S from the left to the right (board conveyance direction) in FIG. 1 by driving a pair of conveyor rails.

As illustrated in FIG. 2, head moving device 30 is provided with a pair of X-axis guide rails 31, X-axis slider 32, X-axis actuator 33 (refer to FIG. 3), a pair of Y-axis guide rails 35, Y-axis slider 36, and Y-axis actuator 37 (refer to FIG. 3). The pair of Y-axis guide rails 35 are disposed on an upper stage of housing 12 so as to extend parallel to each other in the Y-axis direction. Y-axis slider 36 is spanned by the pair of Y-axis guide rails 35. Y-axis actuator 37 moves Y-axis slider 36 in the Y-axis direction along Y-axis guide rail 35. The pair of X-axis guide rails 31 are disposed on a front surface of Y-axis slider 36 so as to extend parallel to each other in the X-axis direction. X-axis slider 32 is spanned by the pair of X-axis guide rails 31. X-axis actuator 33 moves X-axis slider 32 in the X-axis direction along X-axis guide rail 31. Head 40 is attached to X-axis slider 32. Head moving device 30 moves head 40 in the X-axis direction and the Y-axis direction by moving X-axis slider 32 and Y-axis slider 36.

As illustrated in FIG. 3, head 40 is provided with Z-axis actuator 41 and θ-axis actuator 43. Z-axis actuator 41 moves suction nozzle 45 in the up-down direction (Z-axis direction). In addition, θ-axis actuator 43 rotates suction nozzle 45 around the Z-axis. Although not illustrated, the suction port of suction nozzle 45 selectively communicates with the negative pressure source, the positive pressure source, and the air introduction port by a solenoid valve. Head 40 can pick up the component by the negative pressure acting on the suction port by causing the suction port of suction nozzle 45 to abut on the upper surface of the component in a state where the suction port of suction nozzle 45 is in communication with the negative pressure source. In addition, by causing the suction port of suction nozzle 45 to communicate with the positive pressure source, head 40 can release the pickup of the component by the positive pressure acting on the suction port.

Part camera 24 is disposed between component supply device 21 and board conveyance device 22 of base plate 11. When a component picked up by suction nozzle 45 passes above part camera 24, part camera 24 images the bottom surface of the component from a direction perpendicular to the bottom surface of the component. The captured image imaged by part camera 24 is output to control device 60. Since image processing for recognizing a component on the captured image of part camera 24 is performed, as a pre-mounting inspection before the component is mounted, control device 60 performs determination whether the component is picked up by suction nozzle 45, determination whether the picked up component is normal, determination whether the amount of each of the positional deviations ($\Delta x$, $\Delta y$, $\Delta \theta$) in the X-axis direction, the Y-axis direction, and the θ-axis direction of the picked up component is within an allowable range, and the like.

Mark camera 25 is attached to X-axis slider 32. Mark camera 25 images a mark affixed to the surface of board S from a direction perpendicular to the surface. The captured image imaged by mark camera 25 is output to control device 60. Control device 60 confirms the position of board S by performing image processing for recognizing the mark on the captured image of mark camera 25.

Discard box 26 is intended to discard a component that is a target of the abnormality when an abnormality is occurred in the picked up component. When head 40 mounts multiple types of components, nozzle station 27 accommodates multiple suction nozzles 45 for exchange suitable for the pickup according to the type of components.

As illustrated in FIG. 3, control device 60 is configured as a microprocessor centered on CPU 61, and is provided with ROM 62, HDD 63, RAM 64, and input and output interface 65, in addition to CPU 61. These are electrically connected to one another via bus 66. Various detection signals are input to control device 60 via input and output interface 65. Examples of the various detection signals input to control device 60 include a position signal from the X-axis position sensor 34 that sense the position of X-axis slider 32, a position signal from the Y-axis position sensor 38 that sense the position of Y-axis slider 36, a position signal from the Z-axis position sensor 42 that sense the position of suction nozzle 45 in the Z-axis direction, and a position signal from the θ-axis position sensor 44 that sense the position of suction nozzle 45 in the θ-axis direction. In addition, the various signals input to control device 60 include an image signal from part camera 24, an image signal from mark camera 25, and the like. On the other hand, various control signals are output from control device 60 via input and output interface 65. Examples of the various control signals output from control device 60 include a control signal to component supply device 21 and a control signal to board conveyance device 22. In addition, the various control signals output from control device 60 include a drive signal to the X-axis actuator 33, a drive signal to the Y-axis actuator 37, a drive signal to Z-axis actuator 41, and a drive signal to θ-axis actuator 43. Furthermore, the various control signals output from control device 60 include a control signal to part camera 24, a control signal to mark camera 25, and the like. In addition, control device 60 is connected to management device 80 so as to be capable of bidirectional communication, and exchanges data and control signals with each other.

For example, management device 80 is a general-purpose computer, and is provided with CPU 81, ROM 82, HDD 83, RAM 84, input and output interface 85, and the like, as illustrated in FIG. 3. These are electrically connected to one another via bus 86. An input signal from input device 87 such as a mouse and a keyboard is input to management device 80 via input and output interface 85. In addition, an image signal to display 88 is output from management device 80 via input and output interface 85. HDD 83 stores a production job of board S. Here, the production job of board S includes a production schedule such as which components are mounted on board S in which order in each component mounting machine 10, and how many sheets of board S on which the components are mounted in this manner are prepared. Management device 80 generates a production job based on various types of data input by an operator via input device 87, transmits the generated production job to each component mounting machine 10, and thus instructs each component mounting machine 10 to start production.

Figure 4:
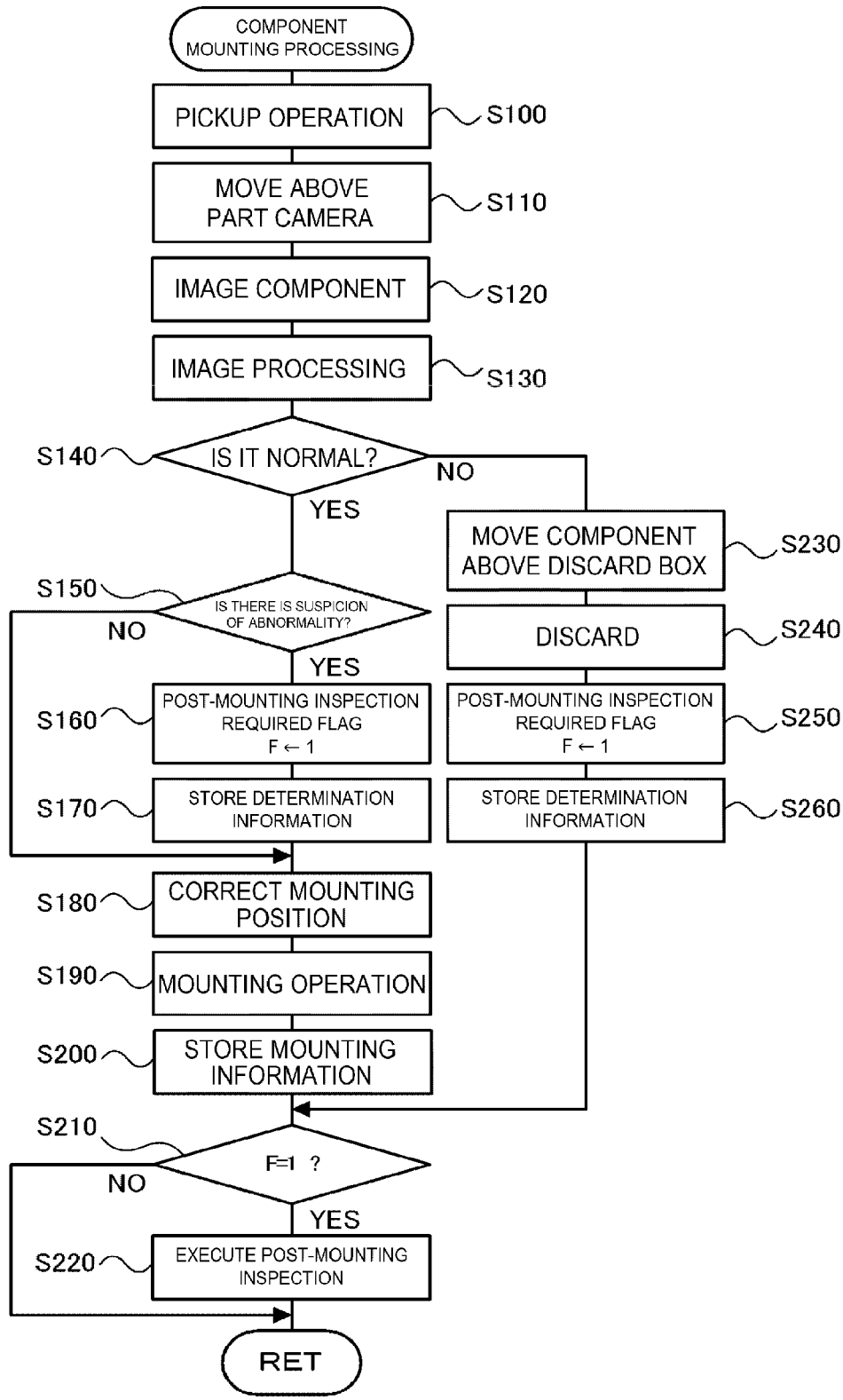
FIG. 4 is a flowchart illustrating an example of a component mounting processing executed by CPU 61 of control device 60.

Next, an operation of component mounting machine 10 of the present embodiment configured as described above will be described. FIG. 4 is a flowchart illustrating an example of a component mounting processing executed by CPU 61 of a control device 60. This processing is executed when the start of production is instructed by the operator. Control device 60 receives the production job transmitted from management device 80, and executes the component mounting processing based on the received production job.

When the component mounting processing is executed, CPU 61 of control device 60 first performs a pickup operation for causing suction nozzle 45 to pick up the component supplied from component supply device 21 (S100). Specifically, the pickup operation is performed by driving and controlling head moving device 30 so that suction nozzle 45 moves above the component supply position to which the component is supplied from component supply device 21, driving and controlling Z-axis actuator 41 so that suction nozzle 45 descends until the tip end (suction port) of suction nozzle 45 abuts on the upper surface of the component, and driving and controlling the solenoid valve so that the negative pressure acts on the suction port of suction nozzle 45. Subsequently, CPU 61 drives and controls head moving device 30 so that the component picked up by suction nozzle 45 moves above part camera 24 (S110), and images the component with part camera 24 (S120).

When the component is imaged, CPU 61 performs image processing for recognizing the component in the obtained captured image (S130). For example, the recognition of the component can be performed by applying pattern matching in order from the center of the captured image using template data of the component registered in advance. As described above, as the pre-mounting inspection, CPU 61 performs determination whether the component is picked up by suction nozzle 45 (the component is normally recognized in the captured image), determination whether the picked up component is normal (correct component), determination whether the amount of each of the positional deviations (Δx, Δy, Δθ) in the X-axis direction, the Y-axis direction, and the θ-axis direction of the picked up component is within the allowable range, and the like by the image processing.

CPU 61 determines whether the result of the pre-mounting inspection is normal (S140). In the present embodiment, CPU 61 determines that it is normal in a case where all the conditions such as the component is picked up by suction nozzle 45, the picked up component is normal, and the amount of each of the positional deviations (Δx, Δy, Δθ) of the picked up component is within the allowable range are satisfied, and determines that it is abnormal in a case where any of the conditions is not satisfied.

When it is determined that the result of the pre-mounting inspection is normal, CPU 61 determines whether there is a suspicion of abnormality (S150). For example, CPU 61 determines that there is a suspicion of abnormality in a case where it takes longer time than usual to perform image processing (pattern matching). In addition, for example, CPU 61 determines that there is a suspicion of abnormality even in a case where a trend different from the trend of the amount of positional deviation so far appears, although the amount of each of the positional deviations (Δx, Δy, Δθ) of the components is within the allowable range (for example, in a case where the amount of positional deviation calculated this time changes by a predetermined amount or more with respect to the amount of positional deviation calculated last time).

Figure 5:
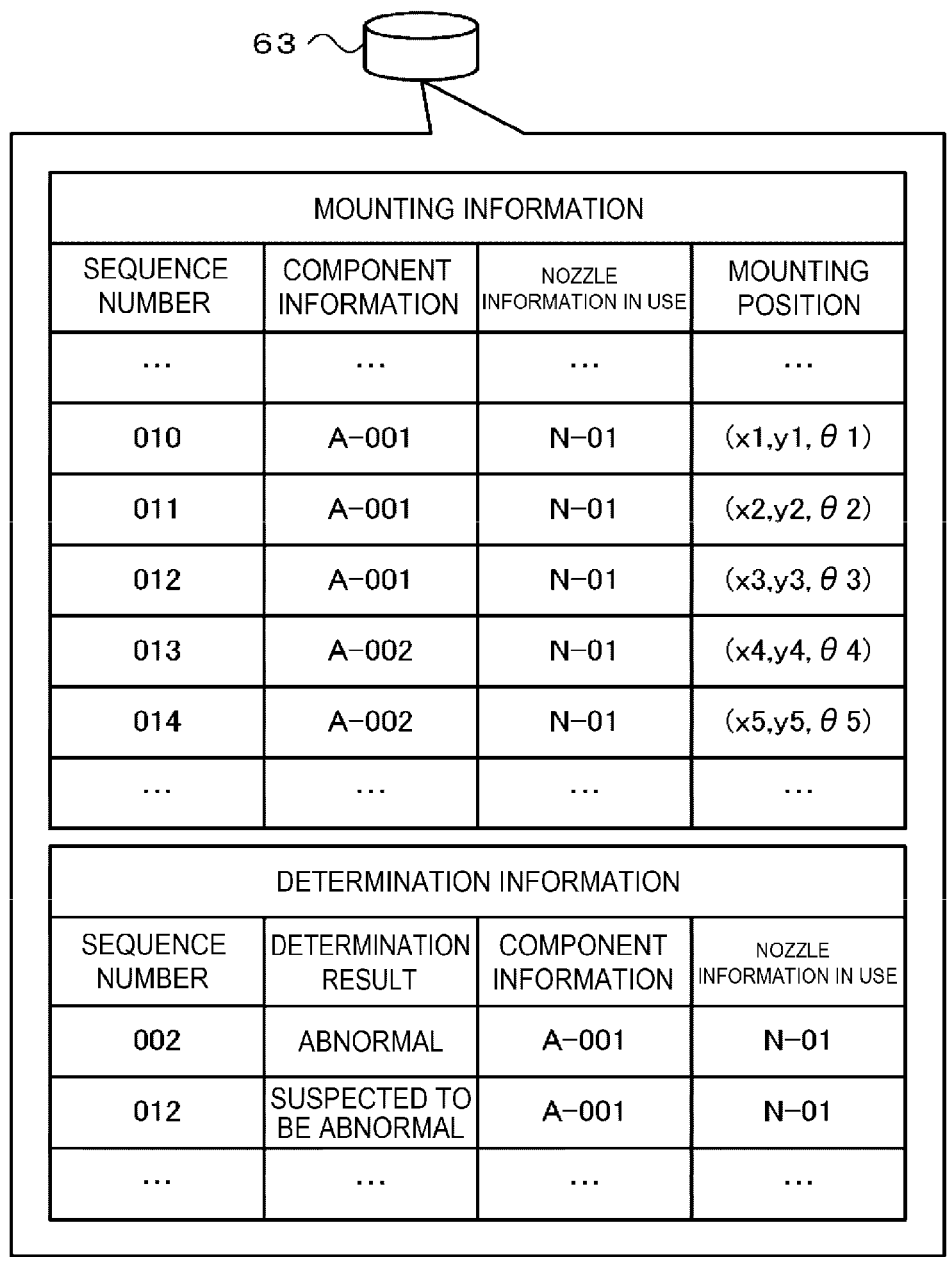
FIG. 5 is an explanatory table illustrating an example of mounting information and determination information.

When it is determined in Steps S140 and S150 that the result of the pre-mounting inspection is normal and there is no suspicion of abnormality, CPU 61 corrects the mounting position of the component based on the amount of each of the positional deviations (Δx, Δy, Δθ) determined by the image processing in Step S130 (S180). CPU 61 performs a mounting operation for mounting the component picked up by suction nozzle 45 at the corrected mounting position (S190). Specifically, the mounting operation is performed by driving and controlling head moving device 30 so that the component picked up by suction nozzle 45 moves above the mounting position, driving and controlling Z-axis actuator 41 so that suction nozzle 45 descends until the component abuts on board S, and driving and controlling the solenoid valve so that the positive pressure acts on the suction port of suction nozzle 45. When the mounting operation is performed, CPU 61 stores the mounting information in HDD 63 (S200). As illustrated in FIG. 5, the mounting information includes a sequence number indicating the mounting order of the mounted components, component information on the mounted components, nozzle information in use on suction nozzle 45 used for mounting the components, a mounting position where the components are mounted, and the like. FIG. 5 also illustrates determination information described later. CPU 61 determines whether post-mounting inspection required flag F has a value 1 (S210). Post-mounting inspection required flag F indicates whether a post-mounting inspection described later needs to be executed. The value 1 is set in post-mounting inspection required flag F in a case where the post-mounting inspection needs to be executed, whereas the value 0 is set in the case where the post-mounting inspection does not need to be executed. When the result of the pre-mounting inspection is normal and there is no suspicion of abnormality, post-mounting inspection required flag F remains at the value 0, so that CPU 61 makes a negative determination in Step S210, and terminates the present processing.

When it is determined in Step S140 that the result of the pre-mounting inspection is abnormal, CPU 61 drives and controls head moving device 30 so that the component picked up by suction nozzle 45 is moved above discard box 26 (S230), and discards the component to discard box 26 by releasing the pickup of the component (S240). CPU 61 sets the value 1 in post-mounting inspection required flag F (S250), stores the determination information in HDD 63 (S260), and proceeds to Step S210. As illustrated in FIG. 5, the determination information includes a sequence number, information indicating the result of the pre-mounting inspection executed in Step S130 (here, information indicating an abnormality), component information related to the picked up component, and nozzle information in use related to suction nozzle 45 used to pick up the component. Next, since it is determined in Step S210 that post-mounting inspection required flag F has the value 1, CPU 61 executes the post-mounting inspection (S220), and terminates the present processing.

When it is determined in Steps S140 and S150 that the result of the pre-mounting inspection is normal and there is a suspicion of abnormality, CPU 61 sets the value 1 in post-mounting inspection required flag F (S160), and stores the determination information in HDD 63 (S170). Subsequently, CPU 61 corrects the mounting position of the component (S180), performs the mounting operation for mounting the component at the mounting position (S190), stores the mounting information in HDD 63 (S200), and then determines whether the post-mounting inspection required flag F has the value 1 (S210). Since it is determined that post-mounting inspection required flag F has the value 1, CPU 61 executes the post-mounting inspection (S220), and terminates the present processing. As described above, in the present embodiment, the post-mounting inspection is executed when it is determined that the result of the pre-mounting inspection is abnormal, or in a case where it is determined that there is a suspicion of abnormality although the result of the pre-mounting inspection is normal. In addition, in a case where the result of the pre-mounting inspection is abnormal, the component picked up by suction nozzle 45 is discarded, whereas in a case where the result of the pre-mounting inspection is normal but abnormality is suspected, the component picked up by suction nozzle 45 is mounted on board S as usual.

Figure 6:
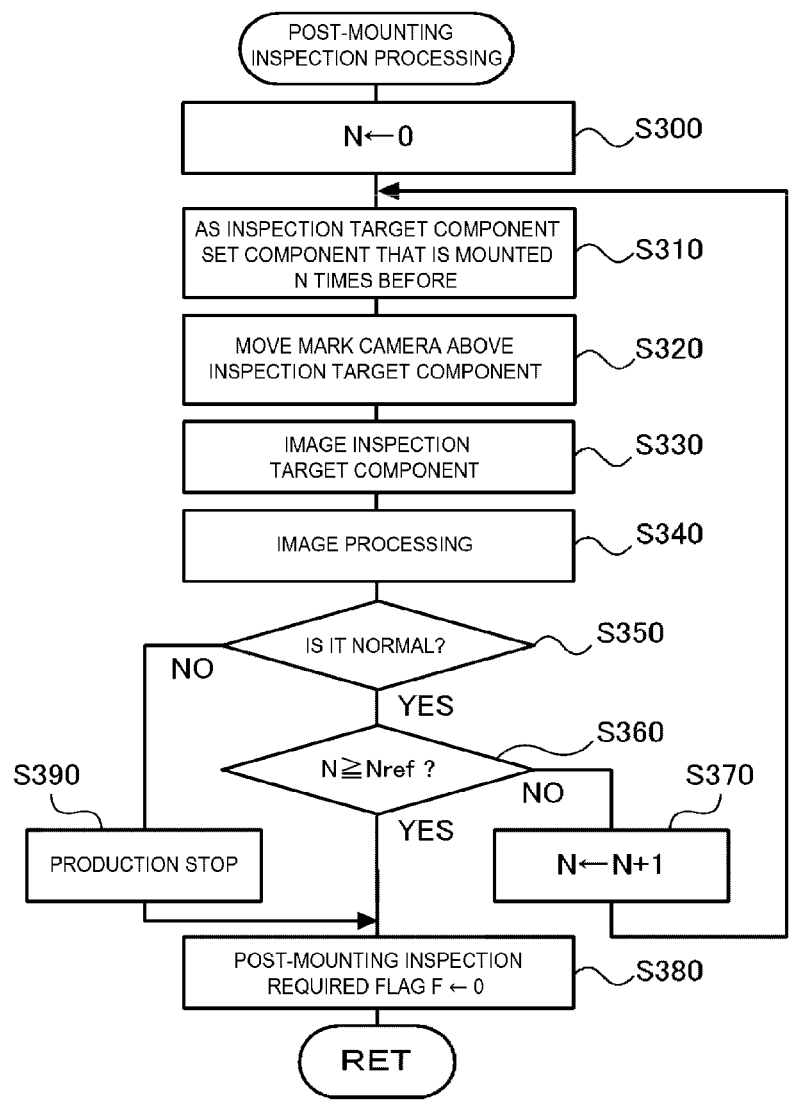
FIG. 6 is a flowchart illustrating an example of a post-mounting inspection processing.

Next, the post-mounting inspection will be described in detail. The post-mounting inspection is performed by executing the post-mounting inspection processing. FIG. 6 is a flowchart illustrating an example of a post-mounting inspection processing. In the post-mounting inspection processing, CPU 61 first initializes the variable N to the value 0 (S300), and sets the component mounted N times before as the inspection target component (S310). Here, since the variable N has a value 0, the component most recently mounted is set as the inspection target component. In a case where the result of the pre-mounting inspection is normal but abnormality is suspected, the component picked up by suction nozzle 45 is mounted on board S as usual. Therefore, CPU 61 determines that an abnormality is suspected, and sets the component mounted on board S as a first inspection target component.

Subsequently, CPU 61 confirms the mounting position of the inspection target component with reference to the determination information and the mounting information, and drives and controls head moving device 30 so that mark camera 25 moves above the mounting position of the confirmed inspection target component (S320). Next, CPU 61 images the inspection target component with mark camera 25 (S330), and performs image processing for recognizing the component in the obtained captured image (S340). CPU 61 determines whether the inspection target component is normally mounted at the mounting position (S350).

When it is determined that the inspection target component is normally mounted, CPU 61 determines whether the variable N is equal to or more than a predetermined number of times Nref (S360). When it is determined that the variable N is less than the predetermined number of times Nref, CPU 61 increments the variable N by the value 1 (S370), sets the component mounted N times before as a new inspection target component, and repeats the processing in Steps S310 to S370 for inspecting the inspection target component. In the course of repetition of the processing in Steps S310 to S370, when it is determined in Step S360 that the variable N is equal to or more than the predetermined number of times Nref without being determined to be abnormal in Step S350, the CPU 61 terminates the post-mounting inspection, sets the value 0 in post-mounting inspection required flag F (S380), and terminates the present processing. As a result, the execution of the component mounting processing is resumed. Here, the predetermined number of times Nref may be determined in advance, for example, as the value 5 or the value 10, or may be set as a value input in advance by an operation of an operator.

On the other hand, in the course of repetition of the processing in Steps S310 to S370, when it is determined in Step S350 that the result of the post-mounting inspection is abnormal before the variable N is equal to or more than the predetermined number of times Nref in Step S360, CPU 61 stops the production (S390), sets the value 0 in post-mounting inspection required flag F (S380), and terminates the present processing. As a result, CPU 61 stops production and makes an operator call. CPU 61 does not execute the component mounting processing until the presence or absence of an abnormality is confirmed by the operator called by the operator call and the processing is instructed to resume.

As described above, CPU 61 determines that the component is normally picked up by suction nozzle 45 when the amount of positional deviation ($\Delta x$, $\Delta y$, $\Delta\theta$) of the component recognized from the captured image in the pre-mounting inspection is within the allowable range. However, depending on the allowable range, an abnormality may be overlooked in the pre-mounting inspection, and as a result, a mounting failure may occur. In addition, even in a case where the result of the pre-mounting inspection is abnormal, it is also conceivable that an abnormality may be overlooked for the mounted component determined to be normal before that. Accordingly, in a case where the result of the pre-mounting inspection is abnormal or abnormality is suspected, CPU 61 performs the post-mounting inspection on each component mounted from the latest time to a predetermined number of times Nref before. As a result, it is possible to detect a mounting failure at an early stage (before reflow processing by reflow device 4). As a result, it is possible to suppress the production of defective products by successively mounting new components on a board in which a mounting failure has occurred.

Here, the correspondence relationship between the configuration elements in the present embodiment and the configuration elements of the present disclosure will be clarified. Suction nozzle 45 of the present embodiment corresponds to a holding member, head 40 corresponds to a head, and control device 60 corresponds to a control device. In addition, head moving device 30 corresponds to a moving device, and mark camera 25 corresponds to an imaging device.

It goes without saying that the present disclosure is not limited to the above-described embodiments, and can be implemented in various aspects without departing from the technical scope of the present disclosure.

For example, in the above embodiment, CPU 61 performs the post-mounting inspection on the already-mounted component in a case where the result of the pre-mounting inspection is abnormal or abnormality is suspected. However, CPU 61 may perform the post-mounting inspection only in a case where the result of the pre-mounting inspection is abnormal, or may perform the post-mounting inspection only in a case where the result of the pre-mounting inspection is normal but abnormality is suspected.

Figure 7:
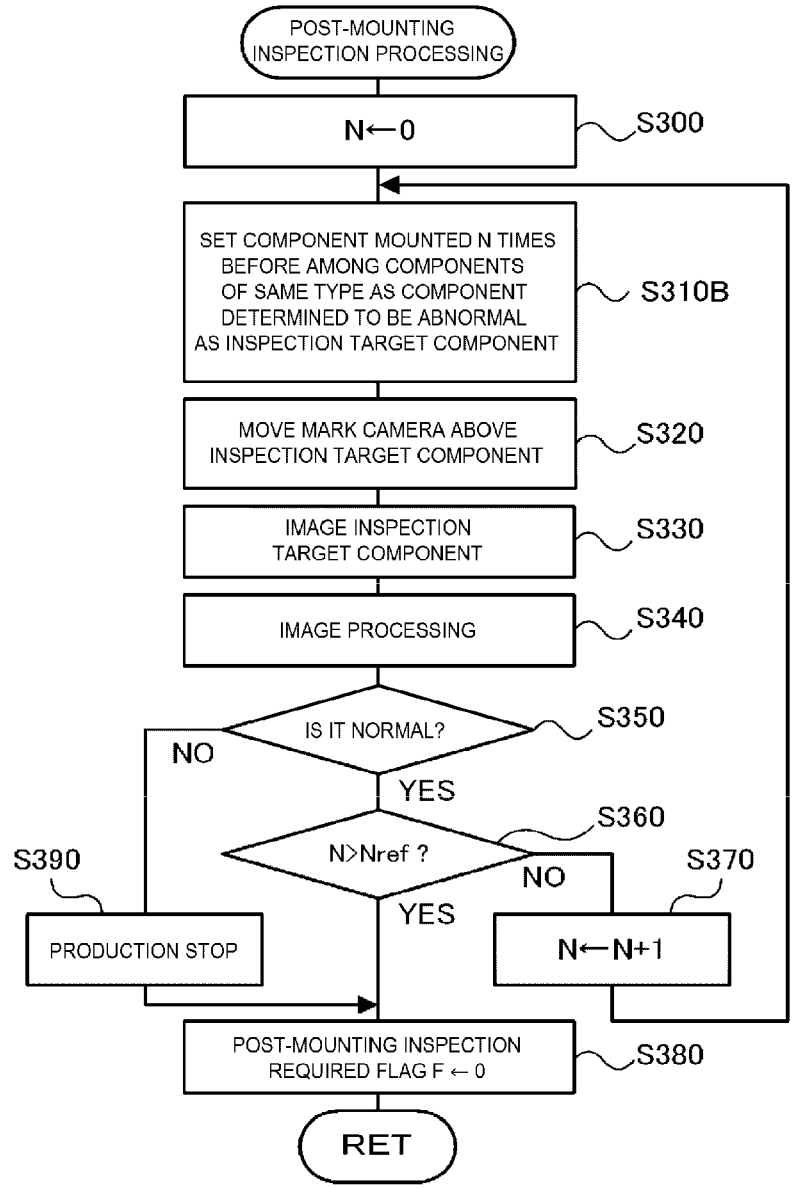
FIG. 7 is a flowchart illustrating a post-mounting inspection processing according to another embodiment.

In the above embodiment, CPU 61 executes the post-mounting inspection processing in FIG. 6, and may execute the post-mounting inspection processing in FIG. 7 instead of FIG. 6. The post-mounting inspection processing in FIG. 7 is processing in which the processing in Step S310 of the post-mounting inspection processing in FIG. 6 is merely replaced with the processing in Step S310B. In the post-mounting inspection processing in FIG. 7, CPU 61 refers to the mounting information and the determination information to extract a component of the same type as the component determined to be abnormal or suspected to be abnormal in the pre-mounting inspection, and sets the component mounted N times before among the extracted components as the inspection target component (S310B). This processing can be performed by extracting mounting information having the same component information as the component information included in the determination information. As a result, it is possible to detect an abnormality that has occurred due to a lot of components or the like.

Figure 8:
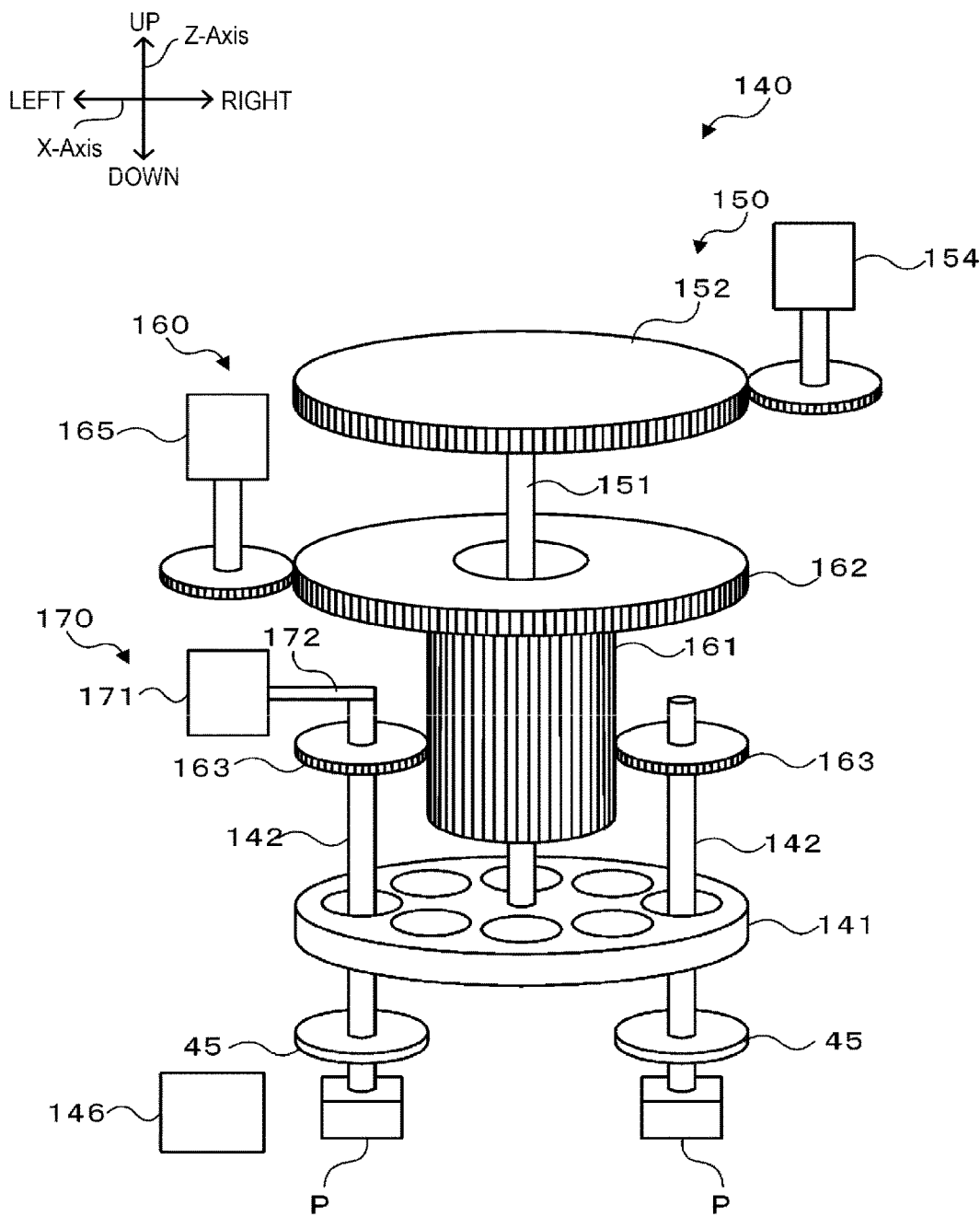
FIG. 8 is a configuration view schematically illustrating a configuration of head 140 according to another embodiment.

In the above embodiment, head 40 is provided with single suction nozzle 45. However, the head may be provided with multiple suction nozzles 45. FIG. 8 is a configuration view schematically illustrating a configuration of head 140 according to another embodiment. As illustrated, head 140 according to another embodiment is configured as a rotary type head including head main body 141, multiple nozzle holders 142, side camera 146, R-axis driving device 150, Q-axis driving device 160, and Z-axis driving device 170.

Head main body 141 is configured as a cylindrical rotating body. Nozzle holders 142 are arranged at predetermined angular intervals (for example, 45 degree intervals) in the circumferential direction with respect to head main body 141, and are supported so as to be able to raise and lower by head main body 141. Suction nozzle 45 is detachably attached to a tip end portion of each nozzle holder 142. Side camera 146 images suction nozzle 45 and the side surface of the component picked up by suction nozzle 45, and outputs the obtained captured image to control device 60. Control device 60 determines the presence or absence of an abnormality such as a pickup error or a pickup deviation by performing image processing for recognizing a component from the captured image input from side camera 146.

R-axis driving device 150 pivots (revolves) multiple suction nozzles 45 around the center axis of head main body 141 in the circumferential direction. R-axis driving device 150 is provided with R-axis 151 extending in the up-down direction and having a lower end attached to a center axis of head main body 141, and R-axis motor 154 that rotationally drives R-axis gear 152 provided at an upper end of R-axis 151. R-axis driving device 150 rotates head main body 141 together with R-axis 151 by rotating and driving R-axis gear 152 by R-axis motor 154 to pivot (revolve) multiple nozzle holders 142 supported by head main body 141 in the circumferential direction together with multiple suction nozzles 45. In addition, R-axis driving device 150 is provided with an R-axis position sensor (not illustrated) that senses the rotational position of R-axis motor 154.

Q-axis driving device 160 rotates each suction nozzle 45 around the center axis thereof. Q-axis driving device 160 is provided with hollow upper and lower two-stage Q-axis gears 161 and 162 inserted so as to be coaxial with and relatively rotatable with respect to R-axis 151, holder gear 163 provided on the upper portion of each nozzle holder 142 and slidably meshed with Q-axis gear 161 at lower stage in the up-down direction, and Q-axis motor 165 for rotationally driving Q-axis gear 162 at upper stage. In Q-axis driving device 160, Q-axis gear 161 rotates integrally with Q-axis gear 162 by rotating and driving Q-axis gear 162 by Q-axis motor 165, and holder gear 163 meshed with Q-axis gear 161 is rotated to rotate each nozzle holder 142 around the center axis thereof. Since suction nozzle 45 is attached to the tip end portion of nozzle holder 142, suction nozzle 45 rotates integrally with nozzle holder 142 by rotating nozzle holder 142. Each holder gear 163 provided on the upper portion of each nozzle holder 142 is a gear having the same number of teeth, and is always meshed with Q-axis gear 161. Therefore, when Q-axis gear 161 rotates, all nozzle holders 142 (suction nozzles 45) rotate in the same rotational direction with the same amount of rotation. In addition, Q-axis driving device 160 is provided with a Q-axis position sensor (not illustrated) that senses the rotational position of Q-axis motor 165.

Z-axis driving device 170 is provided at one location on a pivoting (revolving) trajectory of nozzle holder 142, and can raise and lower nozzle holder 142. Z-axis driving device 170 is provided with Z-axis slider 172 and Z-axis motor 171 for raising and lowering Z-axis slider 172. Z-axis driving device 170 drives Z-axis motor 171 to raise and lower Z-axis slider 172, so that nozzle holder 142 located below Z-axis slider 172 is raised and lowered integrally with suction nozzle 45. Z-axis motor 171 may raise and lower Z-axis slider 172 using a linear motor, or may raise and lower Z-axis slider 172 using a rotation motor and a feeding screw mechanism. In addition, an actuator such as an air cylinder may be used instead of Z-axis motor 171 to raise and lower Z-axis slider 172. In addition, Z-axis driving device 170 is provided with a Z-axis position sensor (not illustrated) that senses the raising and lowering position of Z-axis slider 172.

Figure 9:
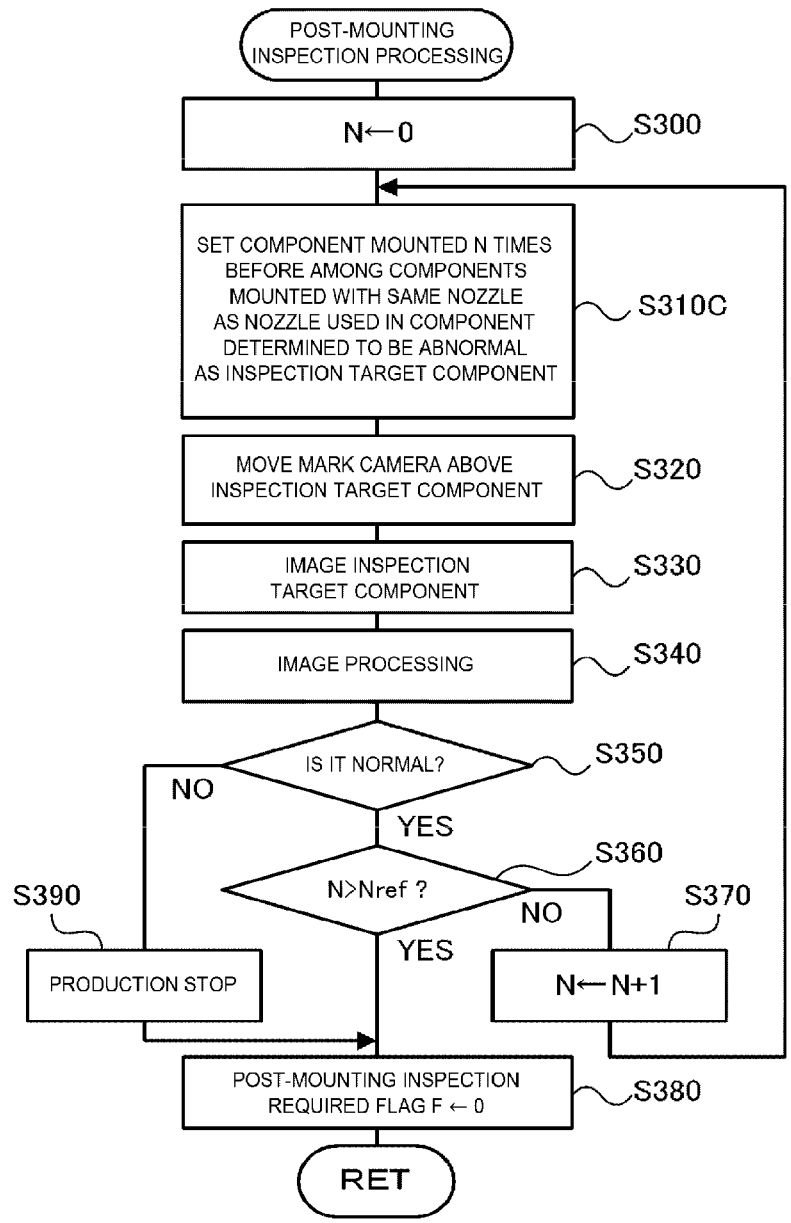
FIG. 9 is a flowchart illustrating a post-mounting inspection processing according to another embodiment.

In component mounting machine 10 including head 140 configured as described above, CPU 61 of control device 60 performs the post-mounting inspection by executing the post-mounting inspection processing illustrated in FIG. 9. The post-mounting inspection processing in FIG. 9 is processing in which the processing in Step S310 of the post-mounting inspection processing in FIG. 6 is merely replaced with the processing in Step S310C. In the post-mounting inspection processing in FIG. 9, CPU 61 refers to the mounting information and the determination information to extract the component mounted using the same suction nozzle 45 (nozzle holder 142) as suction nozzle 45 (nozzle holder 142) used in the component determined to be abnormal or suspected to be abnormal in the pre-mounting inspection, and sets the component mounted N times before among the extracted component as the inspection target component (S310C). In this embodiment, the determination information stored in Steps S170 and S260 of the component mounting processing in FIG. 4 includes holder information for identifying nozzle holder 142 used in addition to each piece of information illustrated in FIG. 5 described above. In addition, the mounting information stored in Step S200 of the component mounting processing includes holder information for identifying nozzle holder 142 used in addition to each piece of information illustrated in FIG. 5 described above. The processing in Step S310C can be performed by extracting mounting information having the same holder information as the holder information included in the determination information. As a result, it is possible to detect an abnormality that has occurred due to specific nozzle holder 142 or specific suction nozzle 45. In a component mounting machine including rotary type head 140, CPU 61 performs a pre-mounting inspection using an image imaged by side camera 146 in addition to the pre-mounting inspection using an image imaged by part camera 24. CPU 61 may perform a post-mounting inspection on the mounted component in a case where it is determined that the result of the pre-mounting inspection using the image imaged by side camera 146 is abnormal or suspected to be abnormal.

In addition, when a component (IC component or the like) having a main body and multiple leads protruding from a side surface of the main body is mounted, component mounting machine 10 may be provided with a coplanarity detecting camera that images the component picked up by the suction nozzle from an oblique direction in order to determine the coplanarity of the multiple leads (the degree to which tip end portions of the multiple leads are located on the same plane). In this case, CPU 61 of control device 60 may perform the pre-mounting inspection using the image imaged by the coplanarity detecting camera, and may perform the post-mounting inspection on the mounted component in a case where it is determined that the result of the pre-mounting inspection is abnormal or suspected to be abnormal.

As described above, a component mounting machine the present disclosure that holds and mounts a component on a board, and it is a gist to include a head having a holding member configured to hold the component; and a control device configured to perform a pre-mounting inspection for inspecting a state of the component held in the holding member, control the head so that the component held in the holding member is mounted on the board in a case where a determination of normality is made in the pre-mounting inspection, and perform a post-mounting inspection for inspecting a state of the component already mounted on the board by the head in a case where a determination of abnormality is made in the pre-mounting inspection or in a case where a determination of abnormality suspicion is made which is within an allowable range determined to be normal but is suspected to be abnormal in the pre-mounting inspection.

The component mounting machine according to the present disclosure includes the head configured to include the holding member configured to hold the component, and the control device configured to control the head. The control device performs a pre-mounting inspection for inspecting a state of a component held in the holding member, and controls the head so that the component held in the holding member is mounted on the board in a case where a determination of normality is made in the pre-mounting inspection. In addition, the control device performs a post-mounting inspection for inspecting a state of the component already mounted on the board by the head in a case where a determination of abnormality is made in the pre-mounting inspection or in a case where a determination of abnormality suspicion is made which is within an allowable range determined to be normal but is suspected to be abnormal in the pre-mounting inspection. Since the allowable range is determined in the determination of the pre-mounting inspection, abnormality may be overlooked by erroneous determination in the pre-mounting inspection depending on the determined allowable range. Therefore, in a case where the determination of abnormality or the determination of abnormality suspicion is made in the pre-mounting inspection, the component mounting machine of the present disclosure performs the post-mounting inspection on a component that has passed the pre-mounting inspection before the determination and was already mounted. Therefore, it is possible to appropriately perform the post-mounting inspection to detect occurrence of a defective product at an early stage. In addition, since the component mounting machine of the present disclosure performs the post-mounting inspection in a case where the determination of abnormality or the determination of abnormality suspicion is made in the pre-mounting inspection, it is possible to suppress the deterioration of the productivity as compared with a device that performs the post-mounting inspection on all of the components mounted on the board. As a result, it is possible to provide the component mounting machine capable of detecting the occurrence of the defective product at an early stage while suppressing the deterioration of the productivity.

In such a component mounting machine of the present disclosure, the control device may perform the post-mounting inspection on components mounted from the latest time to a predetermined number of times before. Alternatively, in the component mounting machine of the present disclosure, the head may include multiple holding members, and the control device may perform the post-mounting inspection on components mounted before a predetermined number of times from a latest time among components held and mounted by the same holding member as a holding member holding a determination target component which is a target of the determination of abnormality or the determination of abnormality suspicion. As a result, it is possible to appropriately detect the abnormality caused by the holding member. Alternatively, in the component mounting machine of the present disclosure, the control device may perform the post-mounting inspection on components mounted before a predetermined number of times from a latest time among components of the same type as a determination target component which is a target of the determination of abnormality or the determination of abnormality suspicion. As a result, it is possible to appropriately detect an abnormality that has occurred due to a lot of components or the like. In these cases, the predetermined number of times may be set based on an operation of the user.

In addition, in the component mounting machine of the present disclosure, the machine may include a moving device configured to move the head, and an imaging device configured to be moved by the moving device to image the board, in which the control device may control the moving device and the imaging device so that an inspection target component which is a target of the post-mounting inspection is imaged by the imaging device, and perform the post-mounting inspection based on a captured image of the inspection target component imaged by the imaging device.

INDUSTRIAL APPLICABILITY

The present disclosure can be applied in a manufacturing industry for the component mounting machine or the like.

REFERENCE SIGNS LIST 1 mounting system, 2 printer, 3 print inspection device, 4 reflow device, 5 mounting inspection device, 10 component mounting machine, 11 base plate, 12 housing, 21 component supply device, 22 board conveyance device, 24 part camera, 25 mark camera, 26 discard box, 27 nozzle station, 30 head moving device, 31 X-axis guide rail, 32 X-axis slider, 33 X-axis actuator, 34 X-axis position sensor, 35 Y-axis guide rail, 36 Y-axis slider, 37 Y-axis actuator, 38 Y-axis position sensor, 40, 140 head, 41 45 suction nozzle, 60 control device, 61 CPU, 62 ROM, 63 HDD, 64 RAM, 65 input and output interface, 66 bus, 80 management device, 81 CPU, 82 ROM, 83 HDD, 84 RAM, 85 input and output interface, 86 bus, 87 input device, 88 display, 141 head main body, 142 nozzle holder, 146 side camera, 150 R-axis driving device, 151 R-axis, 152 R-axis gear, 154 R-axis motor, 155 R-axis position sensor, 160 Q-axis driving device, 161, 162 Q-axis gear, 165 Q-axis motor, 170 Z-axis driving device, 171 Z-axis motor, 172 Z-axis slider, S board

The invention claimed is:

1. A component mounting machine that holds and mounts a component on a board, the machine comprising:
   a head having a suction nozzle configured to hold the component;
   a camera configured to image the component when the component is held in the suction nozzle; and
   a control device including a processor configured to:
   control the head to pick up the component with the suction nozzle,
   obtain an image of the component held in the suction nozzle using the camera,
   perform a pre-mounting inspection for inspecting a state of the component held in the suction nozzle based on the image of the component,
   when a determination of abnormality is made in the pre-mounting inspection,
      control the head to discard the component held in the suction nozzle in a discard box, and
      set a flag indicating that a post-mounting inspection is required when abnormality is determined,
   when a determination of normality is made in the pre-mounting inspection,
      determine whether there is a suspicion of abnormality based on at least one of a time taken to perform the pre-mounting inspection and a change in an amount of positional deviation of the component held in the suction nozzle compared to a positional deviation of a previously held component,
      set the flag indicating that the post-mounting inspection is required when there is a suspicion of abnormality, and
   control the head so that the component held in the suction nozzle is mounted on the board, and
   perform the post-mounting inspection for inspecting a state of a mounted component on the board by the head when the flag is set indicating that the post-mounting inspection is required.

2. The component mounting machine according to claim 1, wherein
   the control device is configured to perform the post-mounting inspection on components mounted less than a predetermined number of mounting times from when a component was last mounted.

3. The component mounting machine according to claim 2, wherein the predetermined number of times of mounting is set based on an operation of a user.

4. The component mounting machine according to claim 1, wherein
   the head includes multiple suction nozzles, and the control device is configured to perform the post-mounting inspection on components mounted less than a predetermined number of mounting times from a latest time a component among components held and mounted by the same suction nozzle as a suction nozzle holding a determination target component which is a target of the determination of abnormality or the determination of abnormality suspicion.

5. The component mounting machine according to claim 1, wherein
   the control device is configured to perform the post-mounting inspection on components mounted less than a predetermined number of mounting times from when a component is mounted among components of the same type as a determination target component which is a target of the determination of abnormality or the determination of abnormality suspicion.

6. The component mounting machine according to claim 1, further comprising: a moving device configured to move the head, wherein the control device is configured to control the moving device and the camera so that an inspection target component which is a target of the post-mounting inspection is imaged by the camera, and performs the post-mounting inspection based on a captured image of the inspection target component imaged by the camera.

* * * * *